United States Patent
Wood et al.

[11] Patent Number: 5,904,546
[45] Date of Patent: May 18, 1999

[54] METHOD AND APPARATUS FOR DICING SEMICONDUCTOR WAFERS

[75] Inventors: Alan G. Wood, Boise; Warren M. Farnworth, Nampa; Salman Akram, Boise, all of Id.

[73] Assignee: Micron Technology, Inc., Boise, Id.

[21] Appl. No.: 08/605,245

[22] Filed: Feb. 12, 1996

[51] Int. Cl.$^6$ .......... H01L 21/301; H01L 21/46; H01L 21/78
[52] U.S. Cl. .......... 438/460; 438/462; 438/464
[58] Field of Search .......... 438/460, 462, 438/464

[56] References Cited

U.S. PATENT DOCUMENTS

| | | | |
|---|---|---|---|
| 3,924,323 | 12/1975 | Trevail et al. | 438/464 |
| 4,224,101 | 9/1980 | Tijburg et al. | 438/463 |
| 5,196,378 | 3/1993 | Bean et al. | 438/460 |
| 5,362,681 | 11/1994 | Roberts, Jr. et al. | 438/464 |
| 5,369,060 | 11/1994 | Baumann et al. | 438/460 |
| 5,426,072 | 6/1995 | Finnica | 438/613 |
| 5,457,072 | 10/1995 | Tamaki et al. | 438/464 |
| 5,547,906 | 8/1996 | Badehi | 438/465 |
| 5,552,345 | 9/1996 | Schrantz et al. | 438/460 |
| 5,597,766 | 1/1997 | Neppl | 438/460 |

OTHER PUBLICATIONS

Chalifour, H. R., et al., "Manufacturing Methods and Technology Engineering High Efficiency, High Power Gallium Arsenide Read Type Impatt Diodes", pp. 22–25, 1976.

Ghandhi, Sorab K. *VLSI Fabrication Principles*, Silicon and Gallium Arsenide, Second Edition, pp. 19–20, 1994.

Van Zant, Peter, *Microchip Fabrication, A Practical Guide to Semiconductor Processing*, Second Edition, pp. 483–484, 1990.

*Primary Examiner*—Kevin M. Picardat
*Assistant Examiner*—Deven Collins
*Attorney, Agent, or Firm*—Stephen A. Gratton

[57] ABSTRACT

A method and apparatus for dicing semiconductor wafers is provided. The method comprises: forming an etch mask on the wafer, and then etching the wafer with a wet etchant, such as KOH, to form a peripheral groove around each die. Etching the wafer can be from the front side of the wafer, from the back side of the wafer or with partial etches from both sides. The etch process can be performed on a single wafer using a spray head apparatus or on batches of wafers using a recirculating dip tank apparatus.

25 Claims, 4 Drawing Sheets

METHOD AND APPARATUS FOR DICING SEMICONDUCTOR WAFERS

FIELD OF THE INVENTION

This invention relates to semiconductor manufacture and more particularly to an improved method and apparatus for dicing a semiconductor wafer into a plurality of singulated dice.

BACKGROUND OF THE INVENTION

In semiconductor manufacture, integrated circuits are formed on a wafer formed of silicon or another semiconducting material. In general, layers of various materials which are either semiconducting, conducting or insulating are utilized to form the integrated circuits. These materials are doped, deposited and etched using various well known processes. Each wafer is processed to include a large number of individual semiconductor dice or chips.

Following the wafer formation process, the wafer is diced to separate the individual dice for packaging or for use in an unpackaged form. The two main techniques for wafer dicing are scribing and sawing. With scribing, a diamond tipped scribe is moved across the surface of the wafer along pre-formed scribe lines. These scribe lines are also referred to as "streets". The diamond scribe forms shallow scratches in the wafer surface. Upon the application of pressure, such as with a roller, the wafer separates along the scribe line. The breaks in the wafer follows the crystal lattice structure of the wafer substrate. Scribing can be used for wafers that are about 10 mils or less in thickness. For thicker wafers, sawing is the preferred method for dicing.

With sawing, a diamond-tipped saw rotating at high rpms contacts and saws the wafer along the streets. Sawing can be partially or completely through the wafer. Typically with saw cutting, the wafer is mounted on a supporting member such as an elastomeric adhesive film stretched across a film frame.

One problem with either scribing or sawing is that chips and gouges can form along the severed edges of the die. In addition, cracks can form and propagate from the edges into the substrate of the die. Chipping and cracking are particularly a problem with scribing because only one side of a rectangular die can be scribed in the <110> direction. Consequently, cleaving of the other side of the die results in a jagged separation line. Because of chipping and cracking, additional spacing is required between the dice on the wafer to prevent damage to the microcircuits. As a result, not as many dice can be formed on a standard sized wafer and wafer real estate is wasted.

Another problem with conventional scribing and sawing processes is that the equipment is complicated and therefore expensive to install and maintain. Diamond tipped scribes and saw blades in particular are very expensive and require frequent replacement. In addition, with these processes the wafers must be scribed or sawed one at a time. Consequently, throughput is limited unless a large number of machines are employed.

To overcome some of the problems associated with scribing and sawing, abrasiveless methods for dicing semiconductor wafers have been proposed. For example, one proposed abrasiveless dicing mechanism can be etching with a wet etchant. However, such an abrasiveless method has not heretofore been successfully utilized for volume semiconductor manufacture. One problem with dicing a wafer using etching techniques is that wet etchants for silicon can adversely affect the exposed bond pads on the dice. Bond pads formed of aluminum are particularly susceptible to degradation by an etchant such as KOH. In addition, any residuals of the etchant on the die can be catastrophic to the die performance.

In view of the foregoing, it is an object of the present invention to provide an improved method and apparatus for dicing semiconductor wafers into singulated dice. It is yet another object of the present invention to provide an improved method and apparatus for dicing semiconductor wafers that is abrasiveless and that does not form cracks or chips in the singulated dice or adversely affect the electrical devices formed on the dice. It is a still further object of the present invention to provide an improved method of wafer dicing that does not require expensive equipment and consumable components and in which a high volume throughput can be achieved. Other objects, advantages and capabilities of the present invention will become more apparent as the description proceeds.

SUMMARY OF THE INVENTION

In accordance with the invention, an improved method and apparatus for dicing semiconductor wafers is provided. The method, simply stated, comprises: forming an etch mask on the wafer, and then etching a peripheral groove around each die on the wafer using the etch mask. The etch process can be performed from the back side of the wafer or from the front side of the wafer. With a front side etch, the etch mask also functions to protect the dice during the etch process. With a back side etch, a protective mask is blanket deposited on the front side of the wafer and a separate etch mask with etch openings is formed on the back side of the wafer. The protective mask, and also the etch mask, can be formed of photoresist or as hard masks out of a material such as silicon nitride ($Si_3N_4$).

The etch process can also be performed partially from the front or back side of the wafer, and then completed from the opposite side of the wafer. In addition, the etch process can be performed on a single wafer or on a batch of wafers. For a single wafer process, a spray head directs the wet etchant at the wafer. For a batch process, a dip tank circulates the wet etchant around batches of wafers held in boats.

During the etching process, the wet etchant etches a peripheral, rectangular shaped, groove around each die and through the full thickness of the wafer. A preferred wet etchant is a mixture of KOH and $H_2O$. This etchant performs an anisotropic etch on monocrystalline silicon in which the etch rate is different along different directions of the crystal lattice structure. The dimensions of the peripheral grooves are controlled by the width of openings in the etch mask, and by the thickness and crystal lattice structure of the wafer substrate.

DETAILED DESCRIPTION OF THE PREFERRED EMBODIMENT

Figure 1:
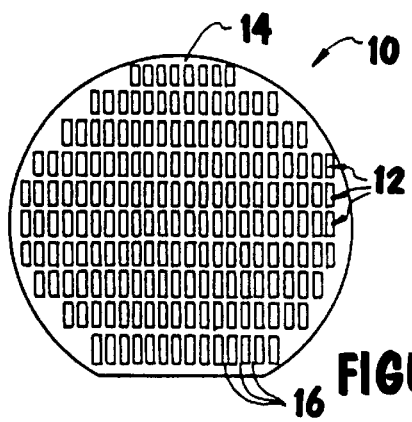
FIG. 1 is a plan view of a semiconductor wafer prior to dicing in accordance with the invention.
Figure 2:
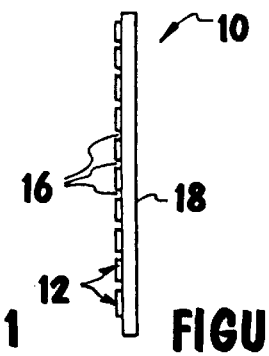
FIG. 2 is a side elevation view of the wafer shown in FIG. 1.

Referring to FIGS. 1 and 2, a semiconductor wafer 10 includes a plurality of semiconductor dice 12 formed using processes that are well known in the art. The present invention is directed to a method for dicing the wafer 10 to separate the individual dice 12. The dice 12 are formed on a front side 14 of the wafer 10 with a generally rectangular peripheral shape and are separated by streets 16. As shown in FIG. 2, the wafer 10 also includes a back side 18 that is substantially flat.

Figure 3A:
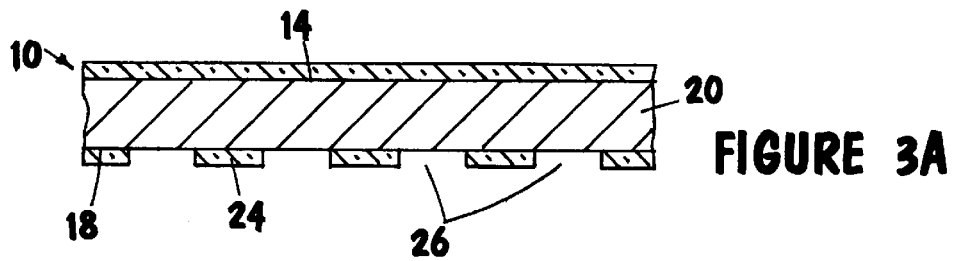
FIGS. 3A–3D are schematic cross sectional views illustrating process steps for dicing the wafer in accordance with the method of the invention by etching from a backside of the wafer.

Referring to FIGS. 3A–3D, steps in the method of the invention are illustrated. As shown in FIG. 3A, the wafer 10 includes a substrate 20 formed of monocrystalline silicon. Initially, a protective mask 22 is formed on the front side 14 of the wafer 10 and an etch mask 24 is formed on the back side 18 of the wafer 10.

The protective mask 22 is a solid mask that covers the semiconductor dice 12 (FIG. 1) formed on the front side 14 of the wafer 10. The protective mask 22 can be formed as a hard mask out of a dielectric material such as silicon nitride ($Si_3N_4$) blanket deposited using a suitable deposition process such as CVD. A typical thickness for the protective mask 22 formed as a hard mask can be from about 500 Å to 3000 Å. Alternately, the protective mask 22 can be formed as a layer of photoresist deposited using a spin-on process and then soft baked to drive out solvents. A typical thickness for a protective mask 22 formed as a layer of photoresist can be from about 10,000 Å to 15,000 Å.

The etch mask 24 on the back side 18 of the wafer 10 can also be formed as a hard mask, or as a layer of photoresist. The etch mask 24 is formed with a pattern of elongated openings 26 that correspond to the criss cross pattern of the streets 16 (FIG. 1) on the front side 14 of the wafer. For a hard etch mask 24, the pattern of openings 26 can be formed using a separate photoresist mask and an etch process. As an example, an etch mask 24 formed of silicon nitride can be etched with a pattern of openings 26 using hot (e.g., 180° C.) phosphoric acid.

Figure 3B:
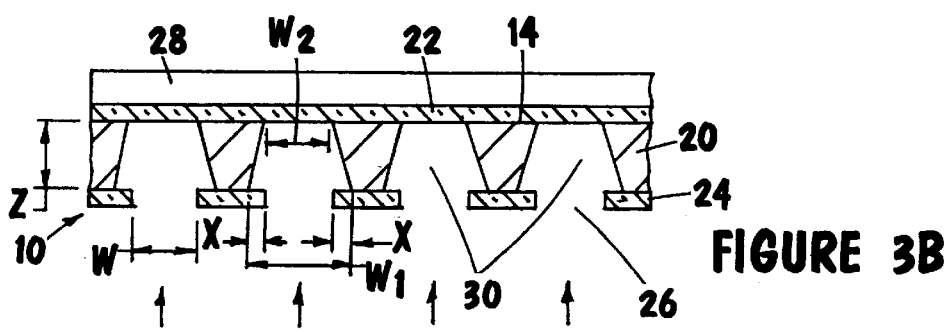

After the masks 22 and 24 are formed, and as shown in FIG. 3B, the wafer 10 is attached to a supporting substrate 28. The supporting substrate 28 can be an adhesive elastomeric material stretched over a film frame. This type of supporting substrate 28 is also known as a sticky backed film frame and is used in the art to support wafers for saw cutting.

Using the supporting substrate 28, the wafer 10 is etched from the backside 18 using a wet etchant as indicated by the arrows in FIG. 3B. One suitable wet etchant for a wafer 10 formed of monocrystalline silicon is a solution containing a mixture of KOH (potassium hydroxide) and $H_2O$. This solution anisotropically etches the silicon substrate 20. The anisotropic etch process forms grooves 30 in the substrate 20 having sidewalls that are sloped at an angle of approximately 54° with the horizontal. The slope of the sidewalls is a function of the different etch rates of monocrystalline silicon along the different crystalline orientations. The surface of the substrate 20 represents the <100>planes of the silicon which etches faster than the sloped sidewalls that represent the <111> plane.

The widths "$w_1$" of the grooves 30 at the back side 18 of the wafer 10 are proportional to the widths "w" of the openings 26 in the etch mask 24 and to the thickness "z" of the substrate 20. The widths "$w_2$" of the grooves 30 at the front side 14 of the wafer can be substantially equal to the widths "w" of the openings 26. The dimension "x" represents the undercut in the x direction under the etch mask 24. The duration of the etch process must be selected to etch completely through the thickness "z" of the substrate 20. Using a solution of KOH, an etch rate in the z direction ($R_z$) of about 30 μm/hr can be achieved. For a wafer having a thickness "z" of about 18 mils, this dictates a total etch time of about 10 hours. These parameters can be related by the formula $(x/z)=R_x/R_z$ where $R_x$ is the etch rate in the x direction and $R_z$ is the etch rate in the z direction. In a similar manner, the width w1 is equal to 2x+w.

Using the anisotropic etch process, the grooves 30 are formed around the outer periphery of the rectangular dice 12 (FIG. 1). The sidewalls of the grooves 30 are formed by the etch process without chips or cracks as can occur with a scribing or sawing process. During the etch process the protective mask 22 protects the dice 12 (FIG. 1) on the front side of the wafer 10 from the wet etchant. In addition, the protective mask 22 provides an etch stop and a support structure for holding the dice 12 in place as the etch process proceeds.

Figure 3C:
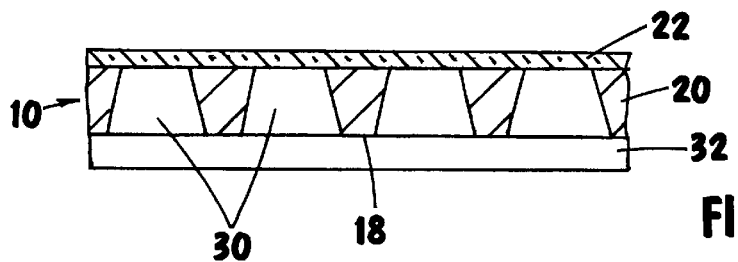

Following the etch process and as shown in FIG. 3C, the etch mask 24 is stripped from the backside 18 of the wafer 10. An etch mask 24 formed of photoresist can be stripped using a suitable chemical solvent. For a positive resist, a solvent such as acetone, methylethylketone or 1-methylethylketone can be used. For a negative resist, a solution of concentrated $H_2SO_4$ and $H_2O_2$ at about 150° C. can be used. Such an etch is referred to in the art as a "piranha" etch. An etch mask 24 formed of silicon nitride can be stripped using a wet etchant such as $H_3PO_4$ that is selective to the substrate 20.

As also shown in FIG. 3C, following the etch process, the back side 18 of the wafer 10 is attached to a supporting substrate 32. The supporting substrate 32 can be similar in construction to the supporting substrate 28 previously described in FIG. 3B.

Figure 3D:
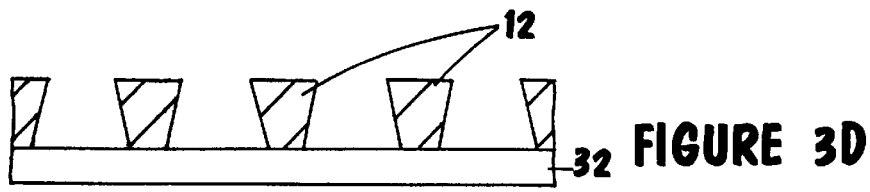

Next, as shown in FIG. 3D, the protective mask 22 is stripped as previously described for etch mask 24. This leaves the singulated dice 12 supported on the supporting substrate 32. The dice 12 can then picked off the supporting substrate 32 for packaging or testing for certification as a known good die (KGD).

Figure 4A:
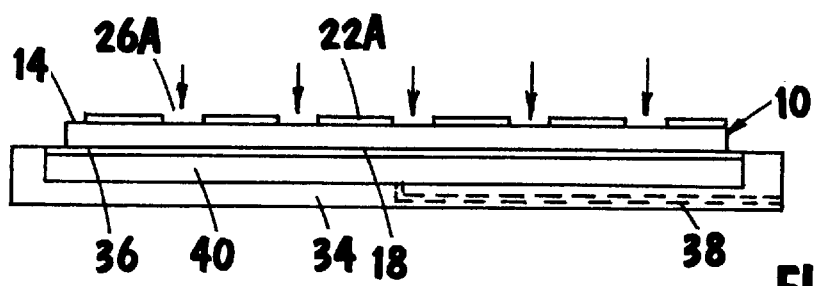
FIGS. 4A–4C are schematic cross sectional views illustrating alternate embodiment process steps for dicing the wafer by etching from a front side of the wafer.
Figure 4B:
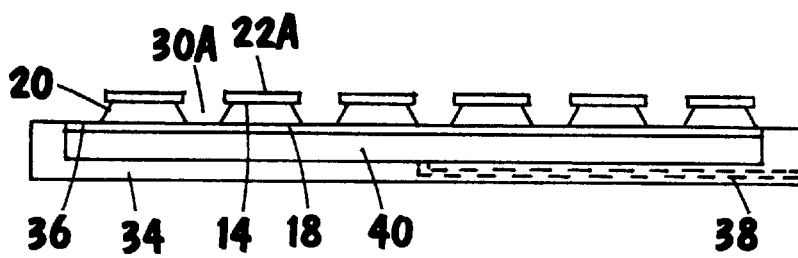
Figure 4C:
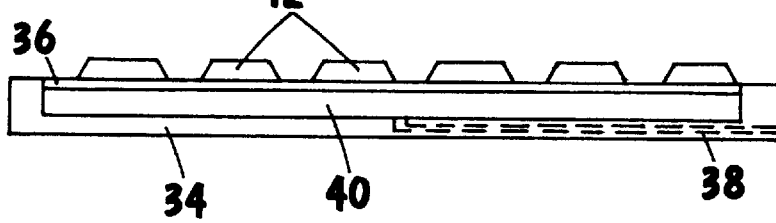

Referring to FIGS. 4A–4C, an alternate embodiment process for dicing the wafer 10 is shown. In this embodiment the wafer 10 is etched from the front side 14 and only one etch mask is formed. Initially, a protective etch mask 22A is formed over the dice 12 (FIG. 1) on the front side 14 of the wafer 10. The protective etch mask 22A can be formed of the same materials using the same process as previously described for the etch mask 24.

The protective etch mask 22A in addition to protecting the dice 12 also functions as an etch mask. The protective etch mask 22A includes a pattern of openings 26A aligned with the streets 16 (FIG. 1) on the wafer 10. The openings 26A provide access for the wet etchant as indicated by the arrows in FIG. 4A. The openings 26A are formed in a criss cross pattern such that each generally rectangular shaped die 12 (FIG. 1) is enclosed by an opening 26A.

As also shown in FIG. 4A, for supporting the wafer 10 during the etch process, the wafer 10 can be mounted on a gel pack support 34. The gel pack support 34 includes an adhesive surface 36 that attaches to the back side 18 of the wafer 10. In addition, the gel pack support 34 includes a sealed bladder 40 in flow communication with a conduit 38 that can be coupled to a vacuum source. The sealed bladder 40 of the gel pack support 34 can be evacuated by the vacuum source for releasing the singulated dice 12 (FIG. 4C). Components for this type of gel pack support 34 are manufactured by Vichem under the trademark Gel Pack.

As shown in FIG. 4B, using the protective etch mask 22A and gel pack support 34, the substrate 20 is etched with grooves 30A substantially as previously described in FIG. 3B for grooves 30. The grooves 30A can be formed through the full thickness of the substrate 20 and extend from the front side 14 to the back side 18 of the wafer 10. Each die is surrounded by a peripheral groove 30A. The shape and dimensions of the grooves 30A are substantially as previously described for grooves 30 in FIG. 3B and can be controlled by the size of the etch openings 26A and by the etch parameters.

Following the etch procedure, the protective etch mask 22A is stripped from the wafer 10. Stripping of the protective etch mask 22A can be as previously described for the protective mask 22 (FIG. 3A) and etch mask 24 (FIG. 3A). As shown in FIG. 4C, stripping of the protective etch mask 22A leaves a plurality of singulated dice 12 supported by the gel pack support 34. With the dice 12 singulated, the gel pack support 34 can be retracted such that the singulated dice 12 can be removed. For example, the dice 12 can be removed from the gel pack support 34 by a vacuum wand of a pick and place apparatus (not shown).

Referring to FIGS. 5A–5E, another alternate embodiment process for dicing the wafer 10 is shown. In the process illustrated in FIGS. 5A–5E, the wafer 10 is initially partially etched from the front side 14 and then etched through from the back side 18. This two step process helps to limit the width of the etched grooves 30AA because with an anisotropic etch the grooves become wider with increasing depth.

Figure 5A:
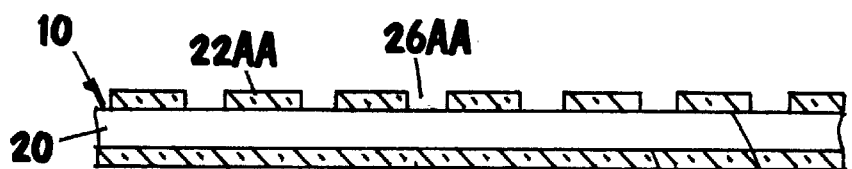
FIGS. 5A–5E are schematic cross sectional views illustrating alternate embodiment process steps wherein the wafer is etched part way through from the front side and then completely through from the back side.

As shown in FIG. 5A, a protective etch mask 22AA is formed on the front side 14 of the wafer 10. The protective etch mask 22AA can be formed as a hard mask, or as a photoresist mask, substantially as previously described for the protective etch mask 22A. The protective etch mask 22AA includes openings 26AA that align with the streets 16 (FIG. 1) on the wafer 10. As also shown in FIG. 5A, an etch mask 24A is formed on the back side 18 of the wafer 10. The etch mask 24A can be formed as a hard mask, or as a photoresist mask, as previously described for etch mask 24.

Figure 5B:
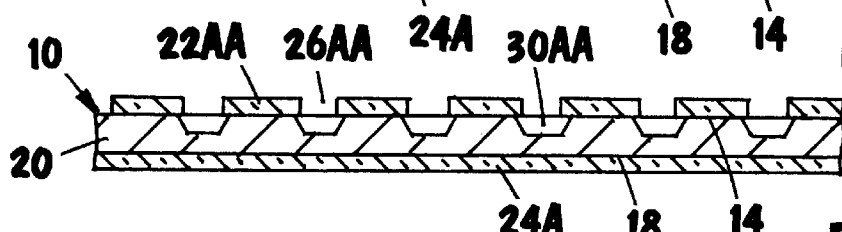

Next, as shown in FIG. 5B, using the protective etch mask 22AA, grooves 30AA are etched part way through the thickness of the wafer substrate 20 using a wet etchant as previously described.

Figure 5C:
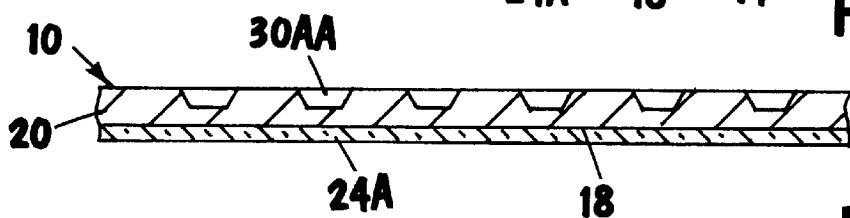
Figure 5D:
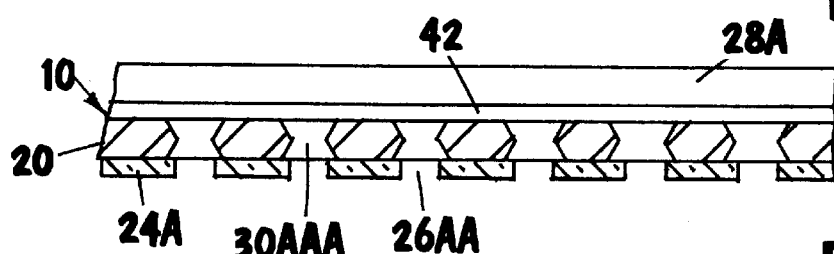

Next, as shown in FIG. 5C, the protective etch mask 22AA is stripped substantially as previously described for the protective etch mask 22A.

Next, as shown in FIG. 5C, a protective overcoating 42 is formed over the dice 12 on the front side 14 of the wafer 10. The protective overcoating 42 can be formed of a material such as silicone, polyimide or glass deposited to a desired thickness using a suitable deposition process. As also shown in FIG. 5C, the front side 14 of the wafer is attached to a supporting substrate 28A. The supporting substrate 28A can be an elastomeric material with an adhesive surface as previously described for supporting substrate 28. As also shown in FIG. 5C, the etch mask 24A is patterned with openings 26AA. The openings 26AA align with the partially formed grooves 30AA in the substrate 20.

Figure 5E:
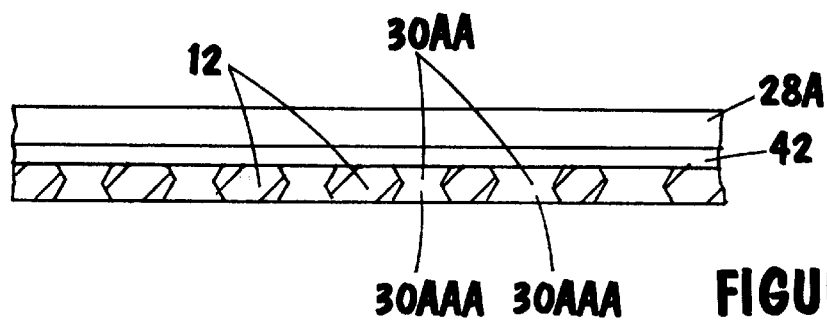

Next, as shown in FIG. 5E, the backside 18 of the wafer 10 is etched using the etch mask 24A. This forms grooves 30AAA that connect with the previously formed grooves 30AA. Following etching of the grooves 30AAA, the etch mask 24A is stripped. The singulated dice 12 remain attached to the supporting substrate 28 and can be detached using a manual or automated pick and place tool.

Figure 6:
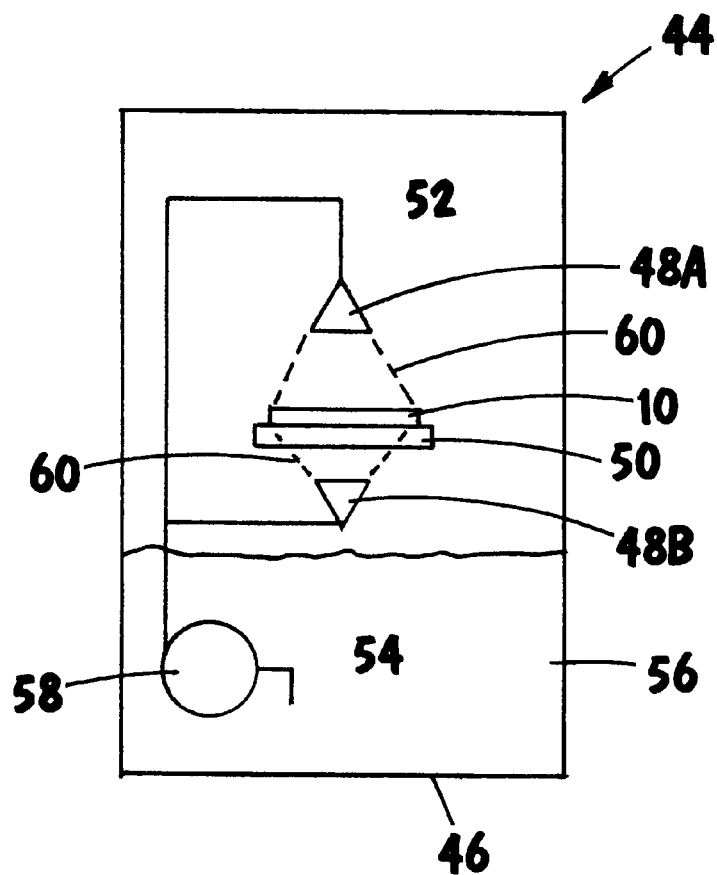
FIG. 6 is a schematic view of a spray head apparatus for dicing the wafer in accordance with the invention by spraying a wet etchant at the wafer.

Referring to FIG. 6, a spray apparatus 44 for performing the above outlined methods is illustrated. The spray apparatus 44 includes: an enclosed etch cabinet 46; a pair of spray heads 48A, 48B mounted within the etch cabinet 46 for directing a wet etchant 54 at the wafer 10; and a support member 50 mounted within the etch cabinet for supporting the wafer 10 during the etch process.

The etch cabinet 46 is formed with a sealed etch chamber 52 and includes a sump 56 adapted to hold the wet etchant 54. A pump 58 is in flow communication with the spray heads 48A, 48B and is adapted to recirculate wet etchant 54 from the sump 56 to the spray heads 48A, 48B.

The spray heads 48A, 48B are adapted to direct the etchant 54 in a spray pattern 60 against the front side 14 and/or the back side 18 of the wafer 10. During the spray process, the wafer 10 is held on the support member 50. The support member 50 can be formed with openings (not shown) to allow the etchant 54 to strike the wafer 10 and then drop into the sump 56.

Figure 7:
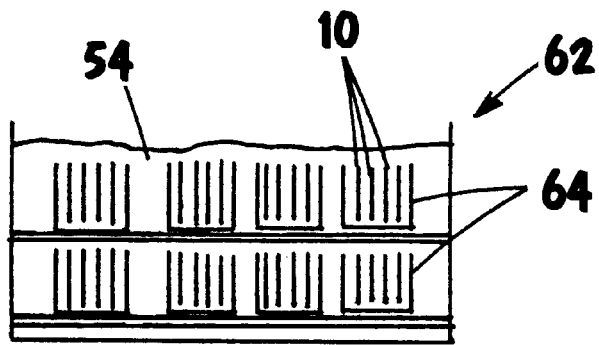
FIG. 7 is a schematic view of a dip tank apparatus for dicing a batch of wafers in accordance with the invention by circulating the wet etchant around batches of wafers.

Referring to FIG. 7, a dip tank apparatus 62 suitable for performing the method of the invention is shown. The dip tank apparatus 62 can be similar in construction to an overflow rinser used to rinse semiconductor wafers. As such, the dip tank apparatus 62 is adapted to hold and recirculate a quantity of the wet etchant 54. The wafers 10 are held in boats 64 submerged within the wet etchant 54. The dip tank apparatus 62 is adapted to process batches of multiple wafers at the same time and includes means for circulating the etchant 54 around the wafers 10.

Thus the invention provides an improved method and apparatus for abrasiveless dicing of semiconductor wafers. Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. A method for dicing a semiconductor wafer comprising a plurality of semiconductor dice, said method comprising:

forming a first mask on a front side of the wafer, the first mask comprising a first layer covering and protecting the dice;

forming a second mask on a back side of the wafer, second mask comprising a second layer having a pattern of etch openings to the back side; and following forming of the first mask and the second mask, etching the wafer through the etch openings using a wet etchant to form a peripheral groove around each of the dice, the groove extending from the back side to the front side of the wafer and the first mask providing an etch stop and protecting the dice during the etching step.

2. The method of claim 1 wherein forming the first mask comprises blanket positing a layer of $Si_3N_4$ on the wafer.

3. The method of claim 1 wherein the etching step comprises dipping the wafer in a tank containing the wet etchant.

4. The method of claim 1 wherein the etching step comprises spraying the wet etchant on the wafer.

5. The method of claim 1 wherein the etch openings have a criss cross pattern that matches a pattern of streets on the wafer.

6. The method of claim 1 wherein the second mask comprises a hard mask.

7. A method for dicing a semiconductor wafer comprising a plurality of semiconductor dice, said method comprising:

forming a protective mask on a first side of the wafer, the protective mask comprising a blanket deposited layer covering the dice;

forming an etch mask on a second side of the wafer, the etch mask including a pattern of etch openings to the second side;

etching the wafer through the etch openings to the protective mask to form a peripheral groove around each die extending from the second side to the first side of the wafer, with the protective mask providing an etch stop and a support structure for the dice during the etching step; and stripping the etch mask and the protective mask to separate the dice.

8. The method of claim 7 wherein the protective mask comprises a hard mask.

9. The method of claim 7 wherein the etch openings are formed in a criss cross pattern corresponding to streets formed on the wafer.

10. The method of claim 7 further comprising supporting the wafer on a supporting substrate during the etching step.

11. The method of claim 7 wherein the etching step comprises an anisotropic etch performed with a wet etchant.

12. The method of claim 7 wherein the etching step comprises dipping the wafer in a tank containing the wet etchant.

13. The method of claim 7 wherein the etching step comprises spraying the wet etchant at the wafer.

14. A method for dicing a semiconductor wafer comprising a plurality of semiconductor dice, said method comprising:

forming a protective mask on a front side of the wafer, the protective mask comprising a blanket deposited layer covering the dice;

forming an etch mask on a back side of the wafer, the etch mask including a pattern of etch openings to the back side;

placing the front side of the wafer on a supporting substrate;

with the wafer on the supporting substrate, etching the wafer through the etch openings by spraying or dipping in a wet etchant to form a peripheral groove around each die extending from the back side to the front side of the wafer, the protective mask providing an etch stop and protecting the dice during the etching step;

removing the wafer from the supporting substrate with the protective mask supporting the dice;

stripping the etch mask and placing the back side of the wafer on a second supporting substrate; and stripping the protective mask to separate the dice while the dice remain supported by the second supporting substrate.

15. The method of claim 14 further comprising controlling a size and shape of the grooves using the etch openings and selected etch parameters during the etching step.

16. The method of claim 14 wherein the wet etchant comprises KOH.

17. The method of claim 14 wherein the protective mask comprises a nitride.

18. The method of claim 14 wherein the protective mask comprises silicon nitride.

19. The method of claim 14 wherein the etching step comprises dipping a plurality of wafers into a tank containing the wet etchant.

20. The method of claim 14 wherein the supporting substrate and the second supporting substrate comprise an elastomeric material stretched over a film frame.

21. A method for dicing a semiconductor wafer comprising a plurality of semiconductor dice, said method comprising:

forming a first etch mask on a first side of the wafer, the first etch mask comprising a layer covering the dice and having a first pattern of etch openings;

forming a second etch mask on a second side of the wafer, the second etch mask comprising a second pattern of etch openings;

etching the wafer through the first pattern of etch openings to form a pattern of grooves extending partially through a thickness of the wafer;

following etching, removing the first etch mask and forming a protective layer on the first side of the wafer covering the dice;

following forming of the protective layer, attaching the first side of the wafer with the protective layer thereon to a supporting substrate;

following attaching, etching the wafer through the second pattern of etch openings to extend the pattern of grooves completely through the thickness of the wafer; and stripping the first and the second etch mask to separate the dice.

22. The method of claim 21 wherein the first etch mask and the second etch mask comprise resist.

23. The method of claim 21 further comprising performing the attaching step using an adhesive layer.

24. The method of claim 21 wherein the etching steps comprise dipping the wafer in a wet etchant.

25. The method of claim 21 wherein the etching steps comprise spraying a wet etchant on the wafer.

* * * * *